(12) United States Patent
Chen et al.

(10) Patent No.: US 6,420,077 B1
(45) Date of Patent: Jul. 16, 2002

(54) CONTACT HOLE MODEL-BASED OPTICAL PROXIMITY CORRECTION METHOD

(75) Inventors: Ming-Jui Chen, Hsinchu; Chin-Lung Lin, Hsinchu Hsien, both of (TW)

(73) Assignee: United Microelectronic Corp., Hsinchu (TW)

( * ) Notice: Subject to any disclaimer, the term of this patent is extended or adjusted under 35 U.S.C. 154(b) by 0 days.

(21) Appl. No.: 09/767,304

(22) Filed: Jan. 23, 2001

(51) Int. Cl.⁷ .................................................. G03F 9/00

(52) U.S. Cl. ........................................................ 430/30
(58) Field of Search ............................. 430/30, 296, 311

*Primary Examiner*—Christopher G. Young
(74) *Attorney, Agent, or Firm*—Charles C. H. Wu; Wu & Cheung, L.L.P.

(57) ABSTRACT

A contact hole model-based optical proximity correction method. The method includes building a contact hole model from the database obtained through a series of test patterns each having a plurality of contact holes of different line widths but identical distance of separation. Line width offsets due to proximity effect are eliminated by referring to the contact hole model.

5 Claims, 4 Drawing Sheets

CONTACT HOLE MODEL-BASED OPTICAL PROXIMITY CORRECTION METHOD

BACKGROUND OF THE INVENTION

1. Field of Invention

The present invention relates to an optical proximity correction method. More particularly, the present invention relates to a contact hole model-based optical proximity correction method.

2. Description of Related Art

As the level of integration in an integrated circuit continues to increase, dimensions of each circuit device must reduce correspondingly. Photolithography is an important step in the fabrication of semiconductors. Photolithography is involved in processes related to the fabrication of metal-oxide-semiconductor (MOST) devices such as the patterning thin films and the marking out areas for implanting dopants. In addition, whether the semiconductor industry is able to produce devices with smaller critical dimensions depends very much on the future development of photolithography. To attain higher level of integration, a few methods capable of increasing mask resolution has been suggested. One such method is optical proximity correction (OPC).

The idea behind optical proximity correction is the eliminate line offset due to proximity effect. Proximity effect refers to the phenomenon that occurs when a beam of light shines through an optical mask and projects onto a wafer. Due to diffraction of light beam on passing a material medium, the light beam will expand out somewhat. Furthermore, some of the light may pass through the photoresist layer into the wafer and then reflect back from the semiconductor substrate leading to interference. Hence, some portion of the photoresist may be double-exposed. The seriousness of such occurrences is intensified when the feature line width of an integrated circuit is small, especially when the wavelength of the light source approaches the width of a line pattern.

At present, contact hole model-based optical proximity correction method relies on test patterns established by the differences in distances and line widths as a database for actual correction.

FIG. 1A is a sketch showing the test patterns used by a conventional contact hole model-based optical proximity correction method.

As shown in FIG. 1A, the square contact hole 102 in test pattern 100 has a line width 104. Distance of separation or pitch from one contact hole 102 to its neighboring contact hole is labeled 106. For example, line width 104 of the square contact hole 102 in test pattern 100 is 0.8 $\mu$m and distance of separation between neighboring contact holes is 1.6 $\mu$m. Similarly, line width of contact hole 112 in test pattern 110 is 0.84 $\mu$m and distance of separation between neighboring contact holes 112 is 1.68 $\mu$m. Finally, line width of contact hole 116 in test pattern 114 is 0.88 $\mu$m and distance of separation between neighboring contact holes 116 is 1.76 $\mu$m. Using a photomask having the test patterns 100, 110 and 114 thereon, a layer of photoresist is exposed and then developed. Thereafter, line widths of various patterns on the developed photoresist layer are measured. Because of proximity effect, contact hole patterns on the wafer are slightly different from the original test patterns on the photomask. Most probably, the corners of the square holes may be rounded and line width may be smaller. After measuring the actual line widths, a line width versus distance of separation graph may be plotted for both the predicted and the actual values.

FIG. 1B is a graph showing the line width versus distance of separation relationship in a conventional contact hole model-based proximity correction method.

As shown in FIG. 1B, when the distance of separation between contact holes is getting smaller, actual line width measured on the photoresist layer is getting longer than the intended line width on the photomask. Conversely, when the distance of separation between contact holes is getting larger, actual line width measured on the photoresist layer is getting closer to the intended line width on the photomask.

Using the established optical proximity correction model shown in FIG. 1B, proper optical mask line widths can supposedly be selected to form the desired line width on the photoresist layer during a contact hole forming process. In practice, the established model can hardly produce the kind of accuracy demanded. This is because proximity effect may vary according to distance of separation, thereby changing the effect on line width. In other words, when the distance of separation is greater than a few times the line width, proximity effect has little influence on line width dimensions. However, as distance of separation is not much different from the line width, proximity effect can affect the ultimate line width dimensions of the contact holes considerably. Hence, a simple distance of separation versus line width relationship can hardly produce the kind of prediction needed for forming contact holes having correct dimensions and position.

Accurate reproduction of contact holes and conductive lines in an integrated circuit is getting more important especially when the semiconductor devices are getting smaller. There is very little tolerance for a misaligned contact hole or a conductive line having a line width too wide or too narrow in an integrated circuit. Hence, optical proximity correction is increasingly important in photolithographic processes.

SUMMARY OF THE INVENTION

Accordingly, one object of the present invention is to provide a contact hole model that can simulates the actual photolithographic conditions more accurately than a conventional model so that up to standard silicon chip is produced after a photolithographic process. Consequently, productivity is increased and quality is improved.

To achieve these and other advantages and in accordance with the purpose of the invention, as embodied and broadly described herein, the invention provides a contact hole model-based optical proximity correction method. The method utilizes a series of test patterns each having a plurality of contact holes separated by identical distance but a different contact hole line width to serve as a database for establishing a contact hole model. Using the contact hole model, proximity effect that may lead to line width offset can be eliminated. Ultimately, desired dimensions of a device are more accurately reproduced and production errors are minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
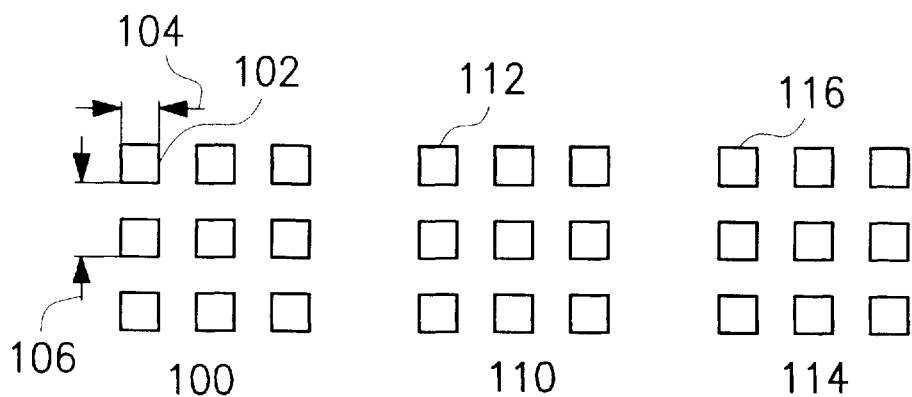
FIG. 1A is a sketch showing the test patterns used by a conventional contact hole model-based optical proximity correction method.
Figure 1B:
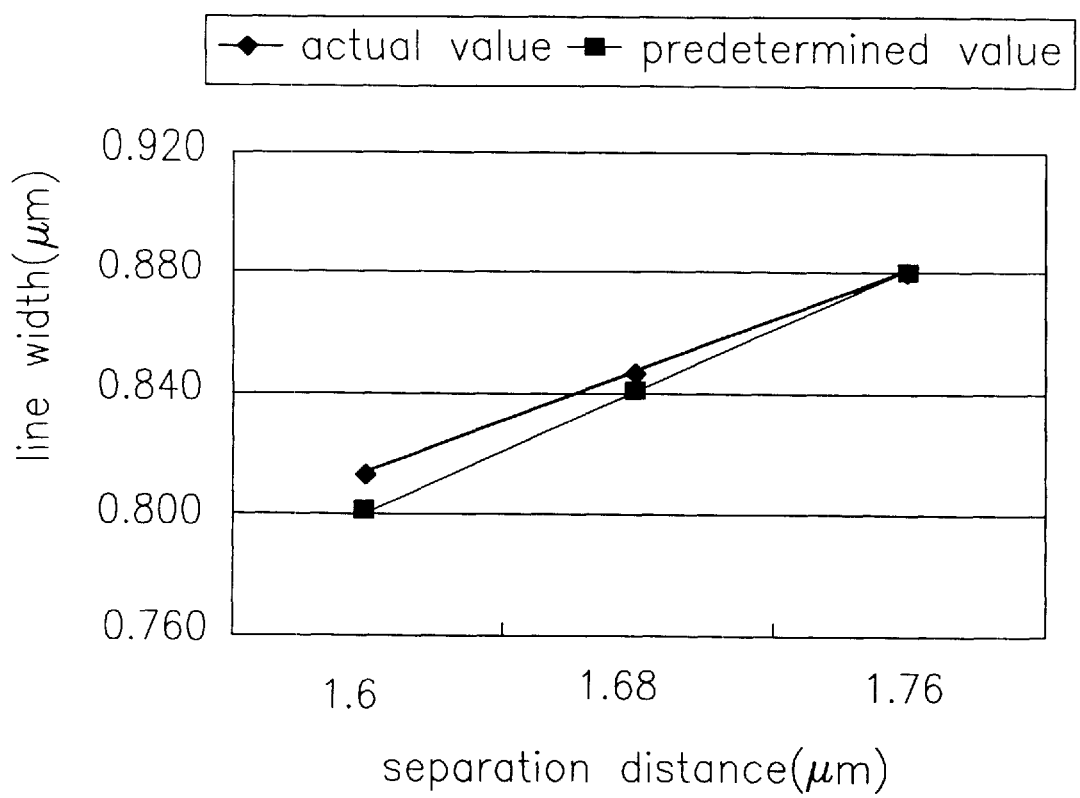
FIG. 1B is a graph showing the line width versus distance of separation relationship in a conventional contact hole model-based proximity correction method.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
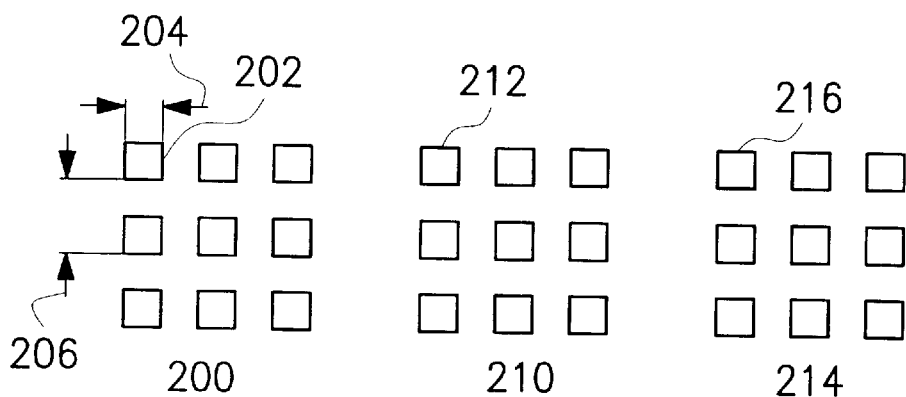
FIG. 2A is a sketch showing the test patterns used by a contact hole model-based optical proximity correction method according to a first embodiment of this invention.

FIG. 2A is a sketch showing the test patterns used by a contact hole model-based optical proximity correction method according to a first embodiment of this invention.

Optical proximity correction (OPC) is a method of increasing the resolution of an optical mask. Resolution of an optical mask can be increased by eliminating line width offset due to proximity effect. In this invention, a series of test patterns each having a plurality of contact holes separated by identical distance but a different contact hole line width is used to form a database for establishing a contact hole model. Using the contact hole model, proximity effect that may lead to line width offset can be eliminated.

As shown in FIG. 2A, the square contact hole 202 in test pattern 200 has a line width 204. Distance of separation or pitch from one contact hole 202 to its neighboring contact hole is labeled 206. For example, line width 204 of the square contact hole 202 in test pattern 200 is 0.8 $\mu$m and distance of separation between neighboring contact holes is 1.6 $\mu$m. Similarly, line width of contact hole 212 in test pattern 210 is 0.84 $\mu$m and distance of separation between neighboring contact holes 212 is 1.6 $\mu$m. Finally, line width of contact hole 216 in test pattern 214 is 0.88 $\mu$m and distance of separation between neighboring contact holes 216 is 1.6 $\mu$m. Using a photomask having the test patterns 200, 210 and 214 thereon, a layer of photoresist is exposed and then developed. Thereafter, line widths of various patterns on the developed photoresist layer are measured. Because of proximity effect, contact hole patterns on the wafer are slightly different from the original test patterns on the photomask. Most probably, the corners of the square holes may be rounded and line width may be smaller. After measuring the actual line widths, a line width versus distance of separation graph may be plotted for both the predicted and the actual values.

Figure 2B:
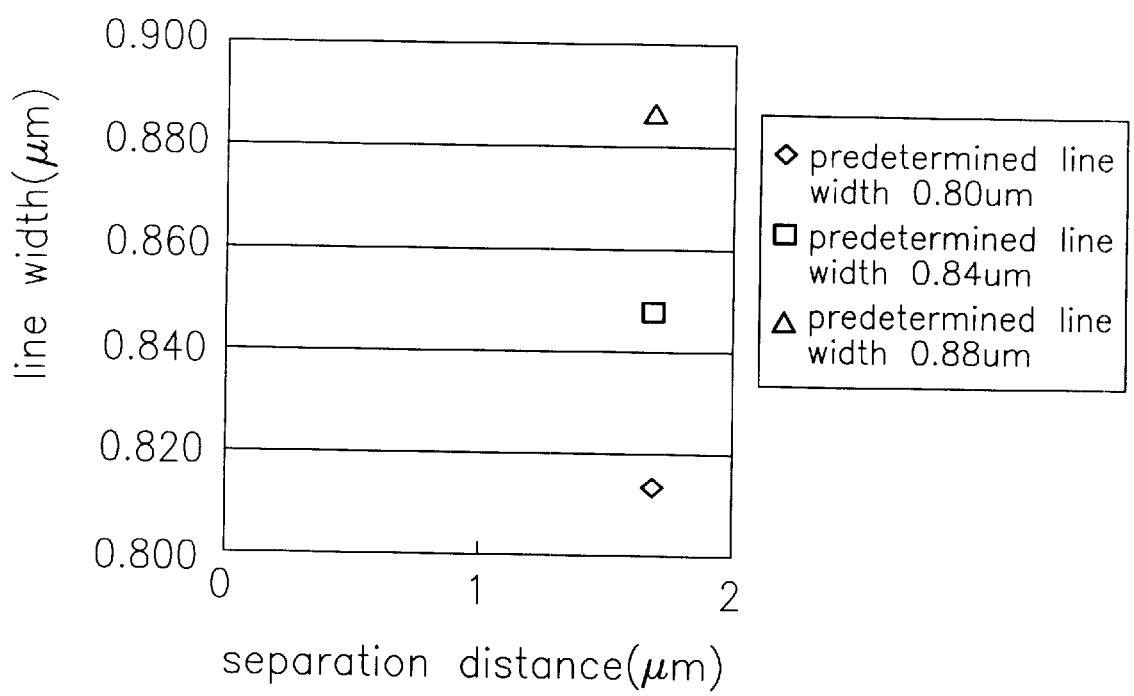
FIG. 2B is a graph showing the line width versus distance of separation relationship according to the test patterns shown in FIG. 2A.

FIG. 2B is a graph showing the line width versus distance of separation relationship according to the test patterns shown in FIG. 2A.

As shown in FIG. 2B, when line width of contact holes is getting smaller, actual line width measured on the photoresist layer is getting longer than the intended line width on the photomask. Conversely, when line width of the contact holes is getting larger, actual line width measured on the photoresist layer is getting closer to the intended line width on the photomask. This is because proximity effect occurs when a beam of light shines through an optical mask and projects onto a wafer. Due to diffraction of light beam on passing a material medium, the light beam will expand out somewhat. Furthermore, some of the light may pass through the photoresist layer into the wafer and then reflect back from the semiconductor substrate leading to interference. Hence, some portion of the photoresist may be double-exposed. The seriousness of such occurrences is intensified when the feature line width of an integrated circuit is small.

Figure 2C:
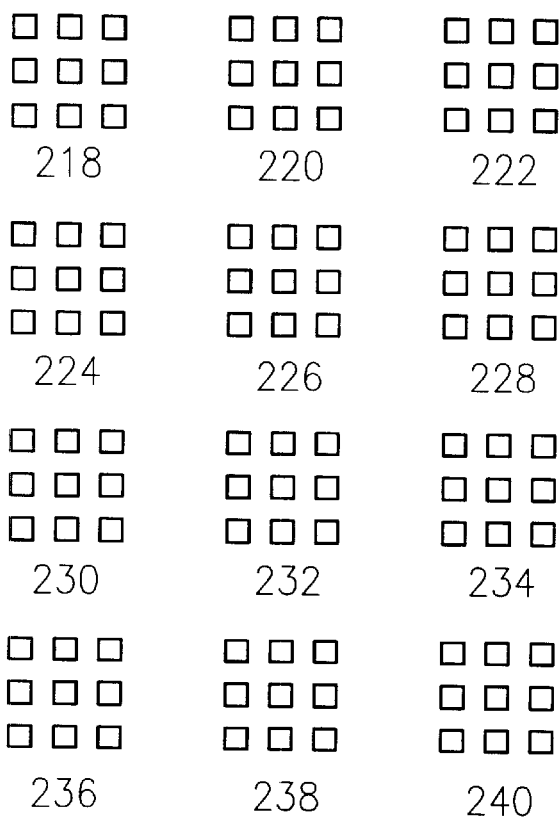
FIG. 2C is a sketch showing the test patterns used by a contact hole model-based optical proximity correction method according to an extension of the test patterns shown in FIG. 2A.

FIG. 2C is a sketch showing the test patterns used by a contact hole model-based optical proximity correction method according to an extension of the test patterns shown in FIG. 2A.

As shown in FIG. 2C, test patterns using the rule of having different line width but identical distance of separation are expanded to form groups. In other words, test patterns 218, 220 and 222 together form a group with contact holes having different line widths but a first identical distance of separation between neighboring contact holes. Similarly, test patterns 224, 226 and 228 together form a group with contact holes having different line widths but a second identical distance of separation between neighboring contact holes; test patterns 230, 232 and 234 together form a group with contact holes having different line widths but a third identical distance of separation between neighboring contact holes; and, test patterns 236, 238 and 240 together form a group with contact holes having different line widths but a fourth identical distance of separation between neighboring contact holes. For example, test patterns 218, 220 and 222 as a group has a distance of separation between neighboring contact holes of 1.64 $\mu$m while the line widths 204 are 0.8 $\mu$m, 0.84 $\mu$m and 0.88 $\mu$m respectively. Similarly, test patterns 224, 226 and 228 as a group has a distance of separation between neighboring contact holes of 1.68 $\mu$m while the line widths 204 are 0.8 $\mu$m, 0.84 $\mu$m and 0.88 $\mu$m; test patterns 230, 232 and 234 as a group has a distance of separation between neighboring contact holes of 1.7 $\mu$m while the line widths 204 are 0.8 $\mu$m, 0.84 $\mu$m and 0.88 $\mu$m; and, test patterns 236, 238 and 240 as a group has a distance of separation between neighboring contact holes of 1.76 $\mu$m while the line widths 204 are 0.8 $\mu$m, 0.84 $\mu$m and 0.88 $\mu$m. Using the aforementioned groups of patterns as shown in FIG. 2C, a series of contact hole models can be established.

Figure 2D:
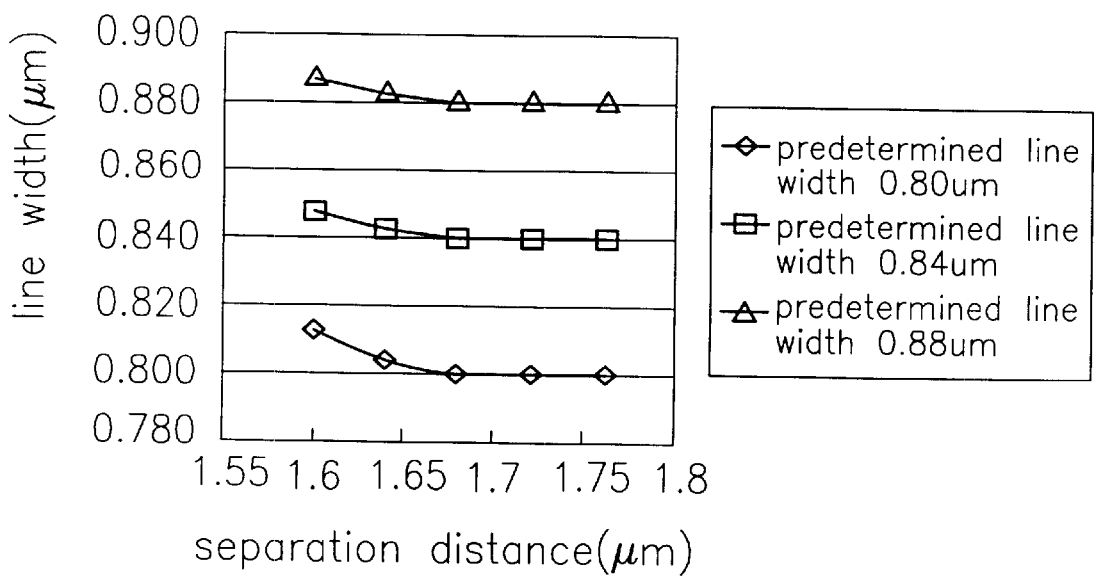
FIG. 2D is a graph showing the line width versus distance of separation relationship according to the extension test patterns shown in FIG. 2C.

FIG. 2D is a graph showing the line width versus distance of separation relationship according to the extension test patterns shown in FIG. 2C. As shown in FIG. 2D, test patterns having different line widths but identical distance of separation between neighboring contact hole are grouped together as a group model. Utilizing grouping according to the distance of separation, several models are obtained and a graph for correcting optical proximity effect is plotted.

Figure 3:
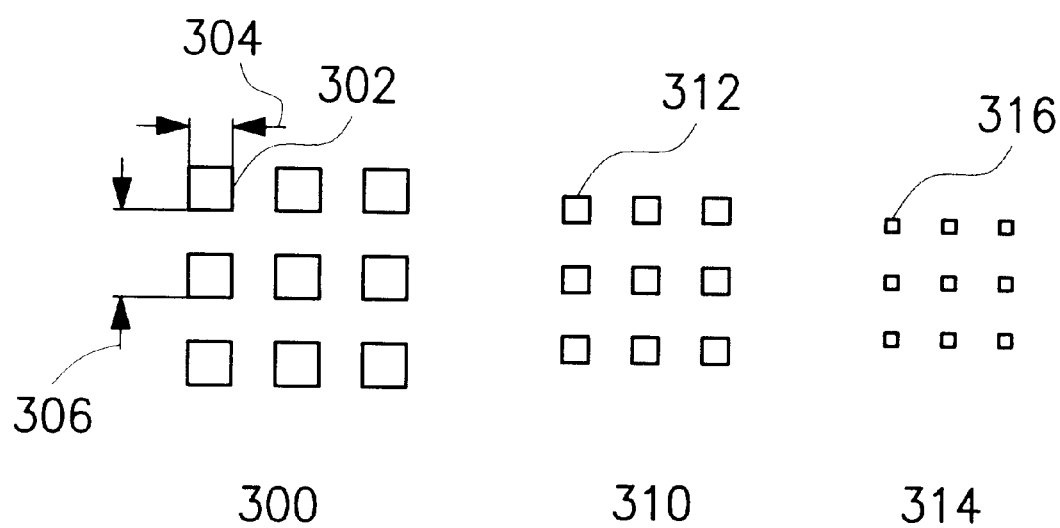
FIG. 3 is a sketch showing the test patterns used by a contact hole model-based optical proximity correction method according to a second embodiment of this invention.

FIG. 3 is a sketch showing the test patterns used by a contact hole model-based optical proximity correction method according to a second embodiment of this invention.

As shown in FIG. 3A, the square contact hole 302 in test pattern 300 has a line width 204. Distance of separation or pitch from one contact hole 302 to its neighboring contact hole is labeled 306. For example, line width 204 of the square contact hole 302 in test pattern 300 is 0.8 $\mu$m and distance of separation between neighboring contact holes is 0.8 μm. Similarly, line width of contact hole 312 in test pattern 310 is 0.4 μm and distance of separation between neighboring contact holes 312 is 0.8 μm. Finally, line width of contact hole 316 in test pattern 314 is 0.2 μm and distance of separation between neighboring contact holes 316 is 0.8 μm. The test patterns 300, 310 and 314 have contact holes of different line widths but identical distance of separation between neighboring holes. The ratio between line width and distance of separation between neighboring lines called pitch ratio is an important design parameter. For example in FIG. 3, the test pattern 300 has a pitch ratio of 0.8:0.8, that is, 1:1. On the other hand, the test pattern 310 has a pitch ratio of 0.4:0.8, that is, 1:2. Similarly, the test pattern 314 has a pitch ratio of 0.2:0.8, that is, 1:4. In other words, each test pattern in FIG. 3 is established using a different pitch ratio of the contact holes. The pitch ratios used in this invention include also 1:0.8, 1:1, 1:1.2, 1:1.4, 1:1.6, 1:1.8, 1:2, 1:2.4, 1:2.8, 1:3.4, 1:4, 1:5, 1:6 and so on. Using a photomask having the aforementioned test patterns thereon, the test patterns are transferred to a photoresist layer and then developed. Line widths on the developed photoresist layer is measured. Due to proximity effect, the contact hole patterns on the silicon chip will differ slightly from the original patterns on the photomask. The corners may be rounded and line width may be reduced. By comparing the measured line widths with the original line widths on the photomask, a contact hole model for optical proximity correction is obtained.

In summary, the invention is capable of more accurately determining the deviation of contact hole from the desired dimensions after a photolithographic pattern transfer so that more standardized and reliable semiconductor product is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A contact hole model-based optical proximity correction method, comprising the steps of:

providing a photomask;

forming a plurality of rectangular test patterns on a photomask with each test pattern having a plurality of contact holes having different line widths but identical distance of separation on a photomask, wherein line width is the side of each contact hole and the distance of separation is the distance from a point along the side of the contact hole to the same position of a neighboring contact hole;

performing a photo-exposure of a photoresist layer on a silicon chip using a photomask with the test patterns thereon and developing the photoresist layer to obtain a plurality of test patterns having different line widths but identical distance of separation on the silicon chip;

measuring the line widths of the test patterns on the silicon chip;

comparing the line widths of the test patterns on the silicon chip with the line widths of the test patterns on the photomask; and establishing a contact hole model for selecting suitable line widths from the panel of test patterns so that contact holes can be precisely reproduced in an actual photolithographic pattern transfer operation.

2. A contact hole model-based optical proximity correction method, comprising the steps of:

providing a photomask;

forming a first group of test patterns on a photomask with each test pattern containing a plurality of contact holes having different line widths but identical distance of separation on a photomask, wherein the line width is the side of each contact hole and the distance of separation is the distance from a point along the side of the contact hole to the same position of a neighboring contact hole;

forming a second group of test patterns on a photomask with each test pattern containing a plurality of contact holes having different line widths but identical distance of separation on a photomask, wherein the second group of test patterns differ from the first group of test patterns in their distance of separation between neighboring contact holes;

forming a plurality of groups of test patterns on the photomask such that each group of test patterns has a different distance of separation between neighboring contact holes;

performing a photo-exposure of a photoresist layer on a silicon chip using a photomask with the test patterns thereon and developing the photoresist layer to obtain a plurality of test patterns having different line widths and distance of separation on the silicon chip;

measuring the line widths of the test patterns on the silicon chip;

comparing the line widths of the test patterns on the silicon chip with the line widths of the test patterns on the photomask; and establishing a contact hole model for selecting suitable line widths from the panel of test patterns so that contact holes can be precisely reproduced in an actual photolithographic pattern transfer operation.

3. A contact hole model-based optical proximity correction method, comprising the steps of:

providing a photomask;

forming a plurality of rectangular test patterns on a photomask with each test pattern having a plurality of contact holes having different line widths but identical distance of separation on a photomask, wherein line width is the side of each contact hole and the distance of separation is the shortest distance from a contact hole to its neighboring contact hole;

performing a photo-exposure of a photoresist layer on a silicon chip using a photomask with the test patterns thereon and developing the photoresist layer to obtain a plurality of test patterns having different line widths on the silicon chip;

measuring the line widths of the test patterns on the silicon chip;

comparing the line widths of the test patterns on the silicon chip with the line widths of the test patterns on the photomask; and establishing a contact hole model for selecting suitable line widths from the panel of test patterns so that contact holes can be precisely reproduced in an actual photolithographic pattern transfer operation.

4. The method of claim 3, wherein the ratios formed by dividing the distance of separation between neighboring contact holes by line width of the contact holes are referred to as the pitch ratios.

5. The method of claim 4, wherein pitch ratios used by the test patterns on the photomask includes 1:0.8, 1:1, 1:1.2, 1:1.4, 1:1.6, 1:1.8, 1:2, 1:2.4, 1:2.8, 1:3.4, 1:4, 1:5 and 1:6.

* * * * *